US007550249B2

(12) United States Patent
Abdallah et al.

(10) Patent No.: US 7,550,249 B2
(45) Date of Patent: Jun. 23, 2009

(54) BASE SOLUBLE POLYMERS FOR PHOTORESIST COMPOSITIONS

(75) Inventors: David Abdallah, Bernardsville, NJ (US); Francis Houlihan, Millilngton, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 250 days.

(21) Appl. No.: 11/372,680

(22) Filed: Mar. 10, 2006

(65) Prior Publication Data
US 2007/0212638 A1 Sep. 13, 2007

(51) Int. Cl.
G03F 7/039 (2006.01)
G03F 7/38 (2006.01)

(52) U.S. Cl. .................. 430/270.1; 430/271.1; 430/326; 430/327; 430/905; 430/909; 430/910

(58) Field of Classification Search .............. 430/270.1, 430/271.1, 326, 327, 905, 909, 910
See application file for complete search history.

(56) References Cited

U.S. PATENT DOCUMENTS

| | | | |
|---|---|---|---|
| 2,310,605 A | 2/1943 | Barnett | |
| 2,625,525 A | 1/1953 | Lynch | |
| 2,703,793 A | 3/1955 | Naylor | |
| 2,778,812 A | 1/1957 | Dreisbach et al. | |
| 2,779,749 A | 1/1957 | Wicklatz | |
| 2,794,014 A | 5/1957 | Dreisbach et al. | |
| 2,899,412 A | 8/1959 | Caldwell et al. | |
| 2,943,077 A | 6/1960 | de Jong et al. | |
| 3,313,785 A | 4/1967 | Zutty | |
| 3,663,507 A | 5/1972 | Vogel et al. | |
| 3,792,026 A | 2/1974 | Atkins et al. | |
| 3,884,696 A | 5/1975 | Bowden | |
| 3,890,287 A | 6/1975 | Moore et al. | |
| 3,893,127 A | 7/1975 | Kaplan et al. | |
| 3,898,350 A | 8/1975 | Gipstein et al. | |
| 3,935,331 A | 1/1976 | Poliniak et al. | |
| 3,935,332 A | 1/1976 | Poliniak et al. | |
| 4,045,318 A | 8/1977 | Himica et al. | |
| 4,097,618 A | 6/1978 | Poliniak | |
| 4,126,712 A | 11/1978 | Poliniak et al. | |
| 4,153,741 A | 5/1979 | Poliniak et al. | |
| 4,267,257 A | 5/1981 | Poliniak et al. | |
| 4,289,845 A | 9/1981 | Bowden et al. | |
| 4,341,861 A | 7/1982 | Pampalone | |
| 4,355,094 A | 10/1982 | Pampalone et al. | |
| 4,393,160 A | 7/1983 | Pampalone | |
| 4,396,702 A | 8/1983 | Desai et al. | |
| 4,397,938 A | 8/1983 | Desai et al. | |
| 4,397,939 A | 8/1983 | Kilichowski | |
| 4,398,001 A | 8/1983 | Cheng et al. | |
| 4,405,776 A | 9/1983 | Pampalone et al. | |
| 4,409,317 A | 10/1983 | Shiraishi | |
| 4,504,372 A | 3/1985 | Kirchmayr et al. | |
| 4,751,168 A | 6/1988 | Tsuchiya et al. | |
| 4,808,697 A | 2/1989 | Drent | |
| 4,996,136 A | 2/1991 | Houlihan et al. | |
| 5,135,838 A | 8/1992 | Houlihan et al. | |
| 5,200,544 A | 4/1993 | Houlihan et al. | |
| 5,298,367 A | 3/1994 | Hoessel et al. | |
| 5,314,978 A | 5/1994 | Kim et al. | |
| 5,384,376 A | 1/1995 | Tunney et al. | |
| 5,728,506 A | 3/1998 | Kometani | |
| 5,919,598 A | 7/1999 | Flaim et al. | |
| 6,139,920 A * | 10/2000 | Smith et al. .................. 427/510 |
| 6,225,019 B1 | 5/2001 | Matsuda et al. | |
| 6,340,734 B1 | 1/2002 | Lin et al. | |
| 6,479,212 B1 | 11/2002 | Matsuda et al. | |
| 6,479,879 B1 | 11/2002 | Pike et al. | |
| 6,730,454 B2 | 5/2004 | Pfeiffer et al. | |
| 6,737,117 B2 | 5/2004 | Boisvert et al. | |
| 6,770,726 B1 | 8/2004 | Arkles et al. | |
| 6,773,864 B1 | 8/2004 | Thackeray et al. | |
| 7,108,958 B2 | 9/2006 | Guerrero | |
| 2001/0036998 A1 | 11/2001 | Sakamoto et al. | |
| 2003/0219678 A1 | 11/2003 | Harada et al. | |
| 2004/0013980 A1 | 1/2004 | Hatakeyama et al. | |
| 2004/0247900 A1 | 12/2004 | Ogihara et al. | |
| 2004/0253461 A1 | 12/2004 | Ogihara et al. | |
| 2006/0141400 A1* | 6/2006 | Hirayama et al. ........... 430/395 |

FOREIGN PATENT DOCUMENTS

| | | |
|---|---|---|
| GB | 744264 | 2/1956 |
| GB | 757046 | 9/1956 |
| GB | 1118950 | 7/1968 |
| JP | 5-125187 A | 5/1993 |

(Continued)

OTHER PUBLICATIONS

Pages 41 and 42 from Gelest Reactle Silicones Catalog, copyright 2004.

(Continued)

Primary Examiner—Richard Schilling
(74) Attorney, Agent, or Firm—Alan P. Kass

(57) ABSTRACT

Base soluble polymer comprising at least one sulfonyl group where at least one carbon atom at α-position and/or β-position and/or γ-position with respect to the sulfonyl group has a hydroxyl group, where the hydroxyl group is protected or unprotected are described.

6 Claims, No Drawings

FOREIGN PATENT DOCUMENTS

| | | |
|---|---|---|
| JP | 2002-179793 A | 2/2002 |
| JP | 2007-279459 A | 10/2007 |
| WO | WO 96/14806 A1 | 5/1996 |
| WO | WO 00/77575 A1 | 12/2000 |
| WO | WO 2004/044025 A2 | 5/2004 |
| WO | WO 2004/046224 A1 | 6/2004 |
| WO | WO 2005/037907 A1 | 4/2005 |
| WO | WO 2005/049681 A2 | 6/2005 |
| WO | WO 2006/107029 A1 | 10/2006 |

OTHER PUBLICATIONS

Pages 15 to 24 of Jun. 5, 2006 Chemical & Engineering News.
English Language Abstract of JP 2002-179793 A.
Jiang, Y. et al, "Design and synthesis of thermally labile polymers for microelectronics: poly(vinyl tert-butyl carbonate sulfone)", Macromolecules (1991) vol. 24, No. 12, pp. 3528-3532.
Jiang, Y. et al., "Poly(vinyl-t-butyl carbonate) synthesis and thermolysis to poly(vinyl alcohol)", Polymer Bulletin (1987) vol. 17, pp. 1-6.
Houlihan, F. et al., "Phase transfer catalysis in the tert-butyloxycarbonylation of alcohols, phenols, enols, and thiols with di-tert-butyl dicarbonate", Can. J. Chem. (1985), vol. 63, pp. 153-162.
Notification of Transmittal of the International Search Report and the Written Opinion of the International Searching Authority or the Declaration (Form PCT/ISA/220), International Search Report (Form PCT/ISA/210), and Written Opinion of the International Searching Authority (Form PCT/ISA/237) for PCT application PCT/IB2007/01846.
Derwent Abstract XP-002147398.
English Language Abstract of JP 5-125187 A.
English Language Abstract of JP 2006-312717 A.
Machine Language English Translation of JP 5-125187 A from Japanese Patent Office.
Machine Language English Translation of JP 2006-312717 A from Japanese Patent Office.
English Language Abstract of JP 2007-279459 A.
Notification of Transmittal of the International Search Report and the Written Opinion of the International Searching Authority or the Declaration (Form PCT/ISA/220), International Search Report (Form PCT/ISA/210), and Written Opinion of the International Searching Authority (Form PCT/ISA/237) for PCT application PCT/IB2007/004198.
R. E. Cook et al., "Effect of Olefin Structure on the Ceiling Temperature for Olefin Polysulfone Formation", J. Polymer Science vol. XXVI, pp. 351-364 (1957).

* cited by examiner

BASE SOLUBLE POLYMERS FOR PHOTORESIST COMPOSITIONS

BACKGROUND OF THE INVENTION

The present invention relates to novel polymers and their use in photoresist compositions.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities. Photoresist resolution is defined as the smallest feature which the resist composition can transfer from the photomask to the substrate with a high degree of image edge acuity after exposure and development. In many manufacturing applications today, resist resolution on the order of less than 0.1 micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

There are few functional groups which enable base solubility of polymers in aqueous base developers. The most highly used group is the acidic hydroxyl group. We have now found that a polymer that has hydroxyl groups or acid labile protected hydroxyl groups that are attached to carbon atom(s) which are alpha and/or beta and/or gamma to a sulfonyl group (—$SO_2$—) can be used to enable base solubility of polymers in aqueous base developers.

SUMMARY OF THE INVENTION

The present invention relates to a base soluble polymer comprising at least one sulfonyl group where at least one carbon atom at α-position and/or β-position and/or γ-position with respect to the sulfonyl group has a hydroxyl group, where the hydroxyl group is protected or unprotected. The sulfonyl group can be positioned in the backbone of the polymer or pendant on the polymer. Preferably, the pKa of the hydroxyl group is less than 10.

Examples of repeating units in the polymer include, but are not limited to,

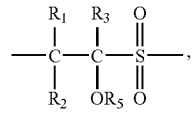 (1A)

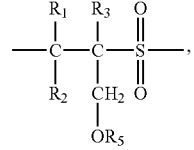 (1B)

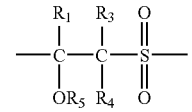 (1C)

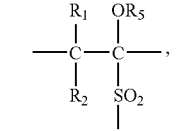 (1D)

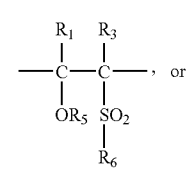 (1E)

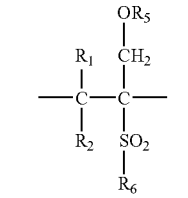 (1F)

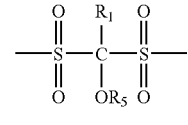 (1G)

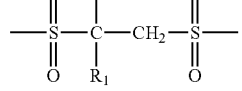 (1H)

wherein each of $R_1$, $R_2$, $R_3$, and $R_4$ are independently selected from hydrogen, alkyl, alkoxy, alicyclic, aryl, aryloxy, acyl, and acyloxy, the alkyl, alkoxy, alicyclic, aryl, aryloxy, acyl, and acyloxy groups being unsubstituted or substituted; $R_5$ is hydrogen or an acid labile group; and $R_6$ is alkyl, alkoxy, alicyclic, aryl, aryloxy, acyl, and acyloxy, the alkyl, alkoxy, alicyclic, aryl, aryloxy, acyl, and acyloxy groups being unsubstituted or substituted. The polymer can further comprise an aromatic vinyl, vinyl ether, acrylate, methacrylate, or alkene monomers.

Formula (1A) is an example of a carbon atom which is in the α-position to the sulfonyl group which has a hydroxyl group, which is protected or unprotected. Formula (1B) is an example of a carbon atom which is in the β-position to the sulfonyl group which has a hydroxyl group, which is protected or unprotected. Formula (1C) is another example of a carbon atom which is in the β-position to the sulfonyl group which has a hydroxyl group, which is protected or unprotected. Formula (1D) is another example of a carbon atom which is in the α-position to the sulfonyl group which has a hydroxyl group, which is protected or unprotected. Formula (1E) and Formula (1F) are other examples of a carbon atom which is in the β-position to the sulfonyl group which has a hydroxyl group, which is protected or unprotected. Formula (1G) is an example of a carbon atom which is α,α-position to the sulfonyl group which has a hydroxyl group, which is protected or unprotected. Formula (1H) is an example of a carbon atom which is in the α,β-position to the sulfonyl group which has a hydroxyl group, which is protected or unprotected.

Photoresist compositions comprising the above base soluble polymers, the compositions also possibly comprising a photoacid generator and/or crosslinking agent are also envisioned in the present application. The invention also relates to a process of imaging a photoresist composition. The invention also relates to an antireflective composition using the above base soluble polymers and a process for forming an image.

DETAILED DESCRIPTION OF THE INVENTION

The present invention relates to a base soluble polymer comprising at least one sulfonyl group where at least one carbon atom at α-position and/or β-position and/or γ-position with respect to the sulfonyl group has a hydroxyl group, where the hydroxyl group is protected or unprotected. The sulfonyl group can be positioned in the backbone of the polymer or pendant on the polymer. Preferably, the pKa of the hydroxyl group is less than 10.

Examples of repeating units in the polymer include, but are not limited to,

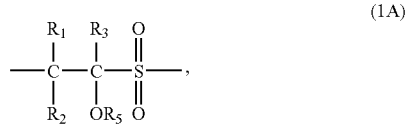
(1A)

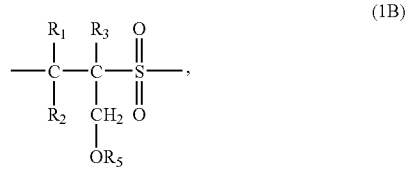
(1B)

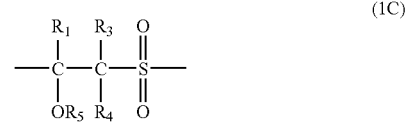
(1C)

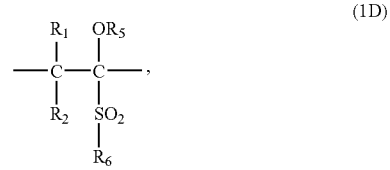
(1D)

-continued

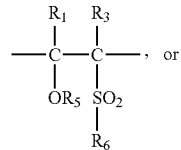
(1E)

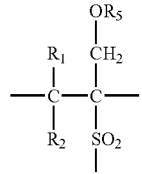
(1F)

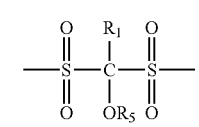
(1G)

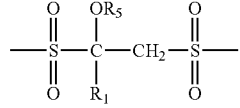
(1H)

wherein each of $R_1$, $R_2$, $R_3$, and $R_4$ are independently selected from hydrogen, alkyl, alkoxy, alicyclic, aryl, aryloxy, acyl, and acyloxy, the alkyl, alkoxy, alicyclic, aryl, aryloxy, acyl, and acyloxy groups being unsubstituted or substituted; $R_5$ is hydrogen or an acid labile group; and $R_6$ is alkyl, alkoxy, alicyclic, aryl, aryloxy, acyl, and acyloxy, the alkyl, alkoxy, alicyclic, aryl, aryloxy, acyl, and acyloxy groups being unsubstituted or substituted. The polymer can further comprise an aromatic vinyl, vinyl ether, acrylate, methacrylate, or alkene monomers.

Formula (1A) is an example of a carbon atom which is in the α-position to the sulfonyl group which has a hydroxyl group, which is protected or unprotected. Formula (1B) is an example of a carbon atom which is in the β-position to the sulfonyl group which has a hydroxyl group, which is protected or unprotected. Formula (1C) is another example of a carbon atom which is in the β-position to the sulfonyl group which has a hydroxyl group, which is protected or unprotected. Formula (1D) is another example of a carbon atom which is in the α-position to the sulfonyl group which has a hydroxyl group, which is protected or unprotected. Formula (1E) and Formula (1F) are other examples of a carbon atom which is in the β-position to the sulfonyl group which has a hydroxyl group, which is protected or unprotected. Formula (1G) is an example of a carbon atom which is α,α-position to the sulfonyl group which has a hydroxyl group, which is protected or unprotected. Formula (1H) is an example of a carbon atom which is in the α,β-position to the sulfonyl group which has a hydroxyl group, which is protected or unprotected.

Photoresist compositions comprising the above base soluble polymers, the compositions also possibly comprising a photoacid generator and/or crosslinking agent are also envisioned in the present application. The invention also relates to a process of imaging a photoresist composition. The invention also relates to an antireflective composition using the above base soluble polymers and a process for forming an image.

Examples of aromatic vinyl monomers include, but are not limited to, styrene, α-methylstyrene, 4-methylstyrene, m-methylstyrene, 4-acetoxystyrene, 4-carboxystyrene, 4-aminostyrene, 4-methoxystyrene, 1,3-dimethylstyrene, tertbutylstyrene, vinylnaphthalene, p-hydroxystyrene, m-hydroxystyrene, o-hydroxystyrene, α-methyl-p-hydroxystyrene, 4-hydroxy-2-methylstyrene, 4-hydroxy-3-methylstyrene, 3-hydroxy-2-methylstyrene, 3-hydroxy4-methylstyrene, 3-hydroxy-5-methylstyrene.

Examples of vinyl ether monomers include, but are not limited to, ethyl vinyl ether, propyl vinyl ether, butyl vinyl ether, octyl vinyl ether, methoxyethyl vinyl ether, ethoxyethyl vinyl ether, hydroxyethyl vinyl ether, benzyl vinyl ether, tetrahydrofurfuryl vinyl ether, phenyl vinyl ether, tolyl vinyl ether.

Examples of acrylate monomers include, but are not limited to, methyl acrylate, ethyl acrylate, butyl acrylate, hexyl acrylate, 2-ethylhexyl acrylate, cyclohexyl acrylate, octyl acrylate, dodecyl acrylate, phenyl acrylate, benzyl acrylate.

Examples of methacrylate monomers include, but are not limited to, methyl methacrylate, ethyl methacrylate, butyl methacrylate, hexyl methacrylate, 2-ethylhexyl methacrylate, cyclohexyl methacrylate, octyl methacrylate, dodecyl methacrylate, phenyl methacrylate, benzyl methacrylate.

Examples of alkene monomers include 1-butene, 2-butene, 2-methyl-1-pentene, 3-methyl-1-pentene, 4-methyl-1-pentene, 3,3-dimethyl-1-pentene, 3,4-dimethyl-1-pentene, 4,4-dimethyl-1-pentene, 2,3,3-trimethyl-1-pentene, 2,3,4-trimethyl-1-pentene, 2,4,4-trimethyl-1-pentene, cycloaliphatic olefins such as cyclopentene, cyclohexene, and the like which are unsubstituted or substituted (for example, 3-methyl-1-cyclopentene, 4-methyl-1-cyclopentene), and allyl based monomers such as allyl benzene.

The acid labile protecting group is a group which may be separated by acid. The group prevents the photoresist compound from dissolving in an alkaline developing solution. If the acid labile protecting group is separated by acid generated by the light exposure, the photoresist compound may be dissolved in the alkaline solution.

The acid labile protecting group can be any of the known protective groups including, for example, the conventional acid labile protecting groups disclosed in U.S. Pat. Nos. 6,830,866, 6,235,447, 6,180,316, 6,136,499, 6,051,678, 5,998,099, 5,879,857, 5,843,624, and 5,750,680, the contents of which are hereby incorporated herein by reference.

Examples of acid labile groups include acetal protecting groups such as alkyloxyalkyl, such as methyloxymethyl, adamantylmethyloxymethyl, bicyclohexyloxymethyl, ethyloxymethyl, menthyloxymethyl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl, and cyclopentyloxymethyl. Acid labile group of the acetal type esters may be used, such as ethoxymethylester, 1-ethoxyethylester, 1-isobutoxyethylester, 1-isopropoxyethylester, 1-ethoxypropylester, 1-(2-methoxyethoxy)ethylester, 1-(2-acetoxyethoxy)ethylester, 1-[2-(1-adamantyloxy)ethoxy]ethylester, 1-[2-(1-adamantancarbonyloxy)ethoxy]ethylester, tetrahydro-2-furylester and tetrahydro-2-pyranylester, 2-alkyl-2-adamantyl, (e.g., 2-methyl 2-adamantyl), 1-adamantyl-1-alkylalkyl and alicyclic ester such as isobornylester, or acid cleaveable alkoxycarbonyl (e.g. tert-butoxycarboxyl, t-BOC), alkyleneoxyalkyl groups, trialkylsilyl, 2-(trialkylsilyl)ethyl, hexafluoro isopropyl, 8-ethyl 8-tricyclodecanyl, tert-butyl, tetrahydropyran-2-yl, 2-methyl tetrahydropyran-2-yl, tetrahydrofuran-2-yl, 2-methyl tetrahydrofuran-2-yl, and 2-acetylmenth-1-yl.

The hydroxyl group which can be on a carbon atom at α-position and/or β-position and/or γ-position with respect to the sulfonyl group when present in the inventive polymer enhance the base solubility of the polymers in aqueous base developer solutions. The base solubility can be masked with appropriate protective groups to incorporate solubility switching. Based on model compounds shown below where the calculated pKa is less than 14 (using pKa calculator from ACD Labs), polymers containing these moieties, as well as those which are exemplified in Formulae 1A to 1H are expected to have hydroxyl groups with pKa's less than 14, preferable less than 10:

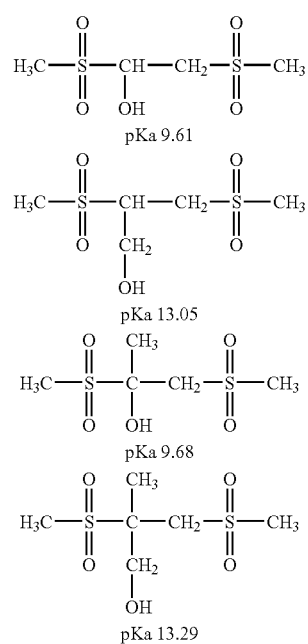

The term acyl refers to all organic radicals derived from an organic carboxylic acid by removal of the hydroxyl group, having the formula R—C(=O)—. The term acyloxy refers to an acyl group bonded to the parent moiety trhough an oxygen atom, shown schematically as R—C(=O)—O—.

The term aryl refers to a radical derived from an aromatic hydrocarbon by the elimination of one atom of hydrogen and can be substituted or unsubstituted. The aromatic hydrocarbon can be mononuclear or polynuclear. Examples of aryl of the mononuclear type include phenyl, tolyl, xylyl, mesityl, cumenyl, and the like. Examples of aryl of the polynuclear type include naphthyl, anthryl, phenanthryl, and the like.

The term aryloxy refers to a group of aryl-O—, where aryl is defined herein.

The term alkyl refers to a straight or branched chain hydrocarbon. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl.

The term alkoxy refers to a group of alkyl-O—, where alkyl is defined herein.

The term alicyclic refers to a non-aromatic hydrocarbon group containing a cyclic structure within, which can be saturated or unsaturated, unsubstituted or substituted, monocyclic, polycyclic or fused rings. Examples include cyclopentane, cyclohexane, cyclooctane, norbornane, norbornene, isobornane, adamantane, bornane, cubane, and tricyclodecane and the like.

The compound capable of producing an acid upon irradiation, a photoacid generator (PAG), of the novel composition is selected from those which absorb at the desired exposure wavelength. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)-methide, diphenyliodonium bis(trifluoromethylsulfonyl)imide and their homologues are also possible candidates. Mixtures of photoactive compounds may also be used.

The photoresist of the present invention comprises the novel polymer, a photoacid generator, and optionally a base additive. In some cases bases or photoactive bases are added to the photoresist to control the profiles of the imaged photoresist and prevent surface inhibition effects, such as T-tops. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (eg. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

The use of non volatile amine additives is also possible. Preferred amines would be ones having a sterically hindered structure so as to hinder nucleophilic reactivity while maintaining basicity, low volatility and solubility in the resist formulation, such as a proton sponge, 1,5-diazabicyclo [4.3.0]-5-nonene, 1,8-diazabicyclo[5,4,0]-7-undecene, cyclic akylamines, or polyether bearing amines such as described in U.S. Pat. No. 6,274,286.

The photoresist can also contain dissolution inhibitors. Typically, dissolution inhibitors are added to the photoresist to decrease the dissolution rate of the unexposed photoresist in the developer. The dissolution inhibitors may be cholate esters, molecules containing phenolic groups partially or fully capped with acid labile groups, or other. More specific examples are tertiary butyl cholate, bis(4-(2'-tetrahydropyranyloxy)phenyl)methane, bis(4-(2'-tetrahydro-furanyloxy) phenyl)methane, bis(4-tert-butoxyphenyl)methane, bis(4-tert-butoxycarbonyloxyphenyl)methane, bis(4-tert-butoxycarbonylmethyloxyphenyl)-methane, bis(4-(1'-ethoxyethoxy)phenyl)methane, bis(4-(1'-ethoxypropyloxy)-phenyl)methane, 2,2-bis(4'-(2"-tetrahydropyranyloxy)) propane, 2,2-bis(4'-(2"-tetrahydrofuranyloxy)phenyl) propane 2,2-bis(4'-tert-butoxyphenyl)propane, 2,2-bis(4'-tert-butoxycarbonyloxyphenyl)propane, 2,2-bis(4-tert-butoxycarbonyl-methyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydro-pyranyloxy)phenyl)valerat tert-butyl 4,4-bis(4'-(2"-tetrahydro-furanyloxy)phenyl)valerate, tert-butyl 4,4-bis (4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis (4'-(1"-ethoxyethoxy)-phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)-phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl) ethane, 1,1,2-tris(4'-(2"-tetrahydro-furanyloxy) ethane 1,1,2-tris(4'-tert-butoxyphenyl)ethane, 1,1,2-tris(4'-tert-butoxycarbonyloxyphenyl)methane, 1,1,2-tris(4'-tert-butoxycarbonylmethyloxy-phenyl)ethane, 1,1,2-tris(4'-(1'-ethoxyethoxy)phenyl)ethane, and 1,1,2-tris(4'-(1'-ethoxypropyloxy)phenyl)ethane The dissolution inhibitor may be present in the photoresist solution at levels ranging from 0 weight % to about 50 weight %. In the embodiment where the polymer is alkali soluble, the dissolution inhibitor is present at levels ranging from 5 weight % to about 40 weight %.

Crosslinking agents are those agents which are capable of forming a crosslinked structure under the action of an acid. Some examples of crosslinking agents include aminoplasts such as, for example, glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life (3-12 months) in catalyzed form. Highly methylated melamine-formaldehyde resins having degrees of polymerization less than two are useful. Monomeric, methylated glycoluril-formaldehyde resins are useful for preparing thermosetting polyester anti-reflective coatings which can be used in conjunction with acid-sensitive photoresists. One example is N,N,N,N-tetra(alkoxymethyl) glycoluril. Examples of N,N,N,N-tetra(alkoxymethyl)glycoluril, may include, e.g., N,N,N,N-tetra(methoxymethyl) glycoluril, N,N,N,N-tetra(ethoxymethyl)glycoluril, N,N,N, N-tetra (n-propoxymethyl)glycoluril, N,N,N,N-tetra(i-porpoxymethyl)glycoluril, N,N,N,N-tetra(n-butoxymethyl) glycoluril and N,N,N,N-tetra(t-butoxymethyl)glycoluril. N,N,N,N -tetra(methoxymethyl) glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril. Similar materials are also available under the NIKALAC tradename from Sanwa Chemical (Japan).

Other aminoplast crosslinking agents are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, ammeline, 2-chloro-4,6-diamino-1,3,5-triazine, 6-methyl-2,4-diamino, 1,3,5-triazine, 3,5-diaminotriazole, triaminopyrimidine, 2-mercapto-4,6-diamino-pyrimidine, 3,4,6-tris(ethylamino)-1,3,5-triazine, tris(alkoxycarbonylamino) triazine, N,N,N',N'-tetramethoxymethylurea, methylolbenzoguanamine or alkyl ether compound thereof, such as tetramethylolbenzoguanamine, tetramethoxymethylbenzoguanamine and trimethoxymethylbenzoguanamine; 2,6-bis(hydroxymethyl)4-methylphenol or alkyl ether compound thereof; 4-tert-butyl-2,6-bis(hydroxymethyl)phenol or alkyl ether compound thereof; 5-ethyl-1,3-bis(hydroxymethyl)perhydro-1,3,5-triazin-2-one (common name: N-ethyldimethyloltriazine) or alkyl ether compound thereof; N,N-dimethyloltrimethyleneurea or dialkyl ether compound thereof; 3,5-bis(hydroxymethyl)perhydro-1,3,5-oxadiazin-4-one (common name: dimethylolurone) or alkyl ether compound thereof; and tetramethylolglyoxazaldiurein or dialkyl ether compound thereof and the like, methylolmelamines, such as hexamethylolmelamine, pentamethylolmelamine, and tetramethylolmelamine as well as etherified amino resins, for example alkoxylated melamine resins (for example, hexamethoxymethylmelamine, pentamethoxymethylmelamine, hexaethoxymethylmelamine, hexabutoxymethylmelamine and tetramethoxymethylmelamine) or methylated/butylated glycolurils, for example as well as those found in Canadian Patent No. 1 204 547 to Ciba Specialty Chemicals. Other examples include, for example, N,N,N,N-tetrahydroxymethylglycoluril, 2,6-dihydroxymethylphenol, 2,2',6,6'-tetrahydroxymethyl-bisphenol A, 1,4-bis[2-(2-hydroxypropyl)]benzene, and the like, etc. Other examples of crosslinking agents include those described in U.S. Pat. No. 4,581,321, U.S. Pat. No. 4,889,789, and DE-A 36 34 371, the contents of which are incorporated by reference. Various melamine and urea resins are commercially available under the Nikalacs (Sanwa Chemical Co.), Plastopal (BASF AG), or Maprenal (Clariant GmbH) tradenames.

The photoresist of the present invention may contain, in addition to photoacid generators and/or crosslinking agents, other components such as additives, such as surfactants, dyes, and other secondary polymers.

The photoresist composition is formed by blending the ingredients in a suitable photoresist solvent. In the preferred embodiment, the amount of polymer in the photoresist preferably ranges from 90% to about 99.5% and more preferably from about 95% to about 99% based on the weight of the solid; i.e., non-solvent photoresist components. The photoresist may comprise a single polymer of the present invention or a mixture of polymers of the present invention comprising different types of unit of structure 1. Other secondary polymers that do not comprise the unit of structure 1 may also be present in the formulation and may be present at levels ranging from about 1 weight % to about 75 weight % of the polymer composition. In the preferred embodiment, the photoactive compound is present in the photoresist in an amount of from about 0.5% to about 10% preferably from about 4% to about 6% based on the weight of the solid photoresist components. In producing the photoresist composition, the solid components of the photoresist are mixed with a solvent or mixtures of solvents such as propylene glycol mono-alkyl ether, propylene glycol alkyl ether acetate, butyl acetate, xylene, 1,3-di(trifluoromethyl)benzene, ethylene glycol monoethyl ether acetate, propylene glycol mono-methyl ether acetate, 2-heptanone, ethyl lactate, ethyl-3-ethoxypropionate, and mixtures of ethyl lactate and ethyl-3-ethoxypropionate, among others.

The antireflective composition generally comprises the base soluble polymer of the present invention and a crosslinking agent. The antireflective composition can further comprise one or more components selected from cross-linking catalysts, solvents, monomeric dyes, surface leveling agents, adhesion promoters, and antifoaming agents.

Cross-linking catalysts include, for example, acid generators, acids, and mixtures thereof. One example of an acid generator is a thermal acid generator. A thermal acid generator is a compound which is not an acid but which is converted to an acid upon heating of the photoresist film. Suitable thermal acid generators useful in the present invention include the ammonium salts of acids where the corresponding amine is volatile. Ammonium salts of acids are prepared by neutralizing an acid with ammonia or an amine. The amine may be a primary, secondary or tertiary amine. The amine must be volatile since it must evaporate from the anti-reflective film upon heating to the temperature required to crosslink the film. When the amine or ammonia evaporates from the anti-reflective film upon heating it leaves an acid in the film. This acid is then present in the anti-reflective film and is employed to catalyze the acid hardening crosslinking reaction upon heating, unless it becomes neutralized by a corresponding amount of a base. Photoacid generators may also be present in the composition and they are described above.

Examples of acid generators include onium salts, benzoin tosylate, nitrobenzyl tosylates, such as 2-nitrobenzyl tosylate, 2,4-dinitrobenzyl tosylate, 2,6-dinitrobenzyl tosylate, 4-nitrobenzyl tosylate; nitrobenzyl benzenesulfonates such as 2-trifluoromethyl-6-nitrobenzyl 4-chlorobenzenesulfonate, as 2-trifluoromethyl-6-nitrobenzyl 4-nitro benzenesulfonate; phenolic sulfonate esters such as phenyl4-methoxybenzenesulfonate, tris(2,3-dibromopropyl)-1,3,5-triazine-2,4,6-trione, 2,4,4,6-tetrabromocyclohexadienone, the alkyl esters of organic sulfonic acids, p-toluenesulfonic acid, dodecylbenzenesulfonic acid, oxalic acid, phthalic acid, phosphoric acid, camphorsulfonic acid, alkyl and aryl sulfonic acid esters, aromatic sulfonamides, alkyl and aryl phosphoric acid esters, their salts, and mixtures thereof. When benzoin tosylate is heated toluene sulfonic acid is produced by a substitution reaction. Alkyl sulfonates which produce the sulfonic acid by elimination upon heating are examples of other thermal acid generators.

Examples of acids which can be used include the non-salts of the above acid generators and include, for example, organic acids such as sulfonic acids (for example, alkyl and aryl sulfonic acids such as phenylsulfonic acid and para-toluenesulfonic acid), and alkyl and aryl phosphoric acids. One or more cross-linking catalysts can be used in the composition.

The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The prepared antireflective composition can be applied to a substrate in the same manner as the photoresist composition mentioned above.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 160° C., and more preferably from about 95° C. to about 135° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, EUV (extreme UV), x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The exposed photoresist-coated substrates are developed to remove the image-wise exposed areas by immersion in a developing solution or developed by spray, puddle or spray-puddle development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides or supercritical carbon dioxide. One preferred developer is an aqueous solution of tetramethyl ammonium hydroxide. Surfactants may also be added to the developer composition. After removal of the coated wafers from the developing solution, one may conduct an optional post-development heat treatment or bake to increase the coating's adhesion and chemical resistance to etching conditions and other substances. The post-development heat treatment can comprise the baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid etching solution or preferably, dry etching. In some cases metals are deposited over the imaged photoresist.

In the embodiment where immersion lithography is used to expose the photoresist, the photoresist coating may optionally have a top coating to prevent contamination problems. The coating substrate can then be imagewise exposed to actinic radiation by immersion lithography, e.g., ultraviolet radiation, at a wavelength of from about 100 nm (nanometers) to about 450 nm, EUV (extreme UV), x-ray, electron beam, ion beam or laser radiation, in any desired pattern, produced by use of suitable masks, negatives, stencils, templates, etc. A typical immersion liquid used comprises water. Other additives may also be present in the immersion liquid.

A process of coating a substrate with an antireflective composition comprising a polymer of the present invention and heating the substrate on a hotplate or convection oven or other well known heating methods at a sufficient temperature for sufficient length of time to remove the coating solvent, and crosslink the polymer if necessary, to a sufficient extent so that the coating is not soluble in the coating solution of a photoresist or in a aqueous alkaline developer. An edge bead remover may be applied to clean the edges of the substrate using processes well known in the art. The heating ranges in temperature from about 70° C. to about 250° C. If the temperature is below 70° C. then insufficient loss of solvent or insufficient amount of crosslinking may take place, and at temperatures above 250° C., the polymer may become chemically unstable. A film of a photoresist composition is then coated on top of the anti-reflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the anti-reflective film, with the remaining photoresist acting as an etch mask.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Synthesis of t-boc Protected vinyl alcohol

In a seperatory funnel, 2.5 g of t-butyl alcohol and 9 g of pyridine were added to 11.5 g chloroformate vinyl ether at −5° C. The reaction mixture was allowed to warm once the addition was complete. The mixture was then distilled under vacuum (25 mm Hg) and a clear, colorless liquid product (14.4 g) was collected at 74° C.

EXAMPLE 2

Synthesis of poly((t-boc vinyl alcohol-co-vinyl benzoate)-alt-sulfone)

A 100 ml round bottom flask was marked on the outside to indicate volume of its contents using water. The round bottom flask was dried in an oven overnight. A magnetic stir bar was placed in the flask and the flask was fitted with a dry ice condenser, nitrogen inlet, $SO_2$ inlet, and addition port fitted with a septum. A nitrogen blanket was established in the flask and 3.67 g of t-boc protected vinyl alcohol (Example 1) and 3.26 g vinyl benzoate were added to the dried flask. The flask was placed into a dry ice/acetone batch. The $SO_2$ gas was introduced into the flask through the $SO_2$ inlet by adjusting the regulator rate to create a steady drip of condensed $SO_2$ into the flask. Once the level of $SO_2$ reached 10 mL (as indicated on by the mark on the outside of the flask), the regulator was closed. Using a syringe, 0.2 mL of t-butyl hydrogen peroxide was added slowly to the flask through the addition septum. After 2 hr, the reaction mixture was poured into methanol and the solid collected by filtration. After drying in air for 1 week, a white amorphous polymer weighted 6.7 g was recovered.

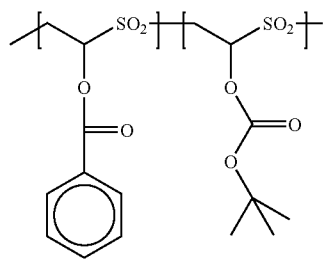

The solubility of the polymer of Example 2 and photoresist formulations was evaluated in PGME (propylene glycol monomethyl ether), MIF Developer (from AZ Electronic Materials) and water. Formulations were spin coated onto wafers at 3000 rpm and baked at the temperatures shown in the table (Table 1).

TABLE 1

| Formulation | PGME | | MIF Developer | | Water | |
| --- | --- | --- | --- | --- | --- | --- |
| | Temp | | | | | |
| | 160° C. | 200° C. | 160° C. | 200° C. | 160° C. | 200° C. |
| A | yes* | yes | yes | yes | no** | no |
| B | yes | no | yes | yes | no | no |
| C | no | no | yes | yes | no | no |
| D | yes | yes | yes | yes | no | no |

A - Polymer from Example 2 (5% in PGME)
B - Formulation A with 30% N,N,N,N-tetra(methoxymethyl)glycoluril
C - Formulation B with 1% dodecylbenzenesulfonic acid
D - Formulation A with 1% dodecylbenzenesulfonic acid
*yes = soluble;
**no = insoluble The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A photoresist composition comprising:
 (a) a base soluble polymer comprising at least one sulfonyl group where at least one carbon atom at α-position and/or β-position with respect to the sulfonyl group has a hydroxyl group, where the hydroxyl group is protected or unprotected; and
 (b) a solvent; and
a photoacid generator.

2. A photoresist composition comprising:
 (a) a base soluble polymer comprising at least one sulfonyl group where at least one carbon atom at α-position and/or β-position with respect to the sulfonyl group has a hydroxyl group, where the hydroxyl group is protected or unprotected; and
 (b) a solvent; and
a crosslinking agent.

3. The process of imaging a photoresist composition comprising the steps of:
 a) coating a substrate with a film of photoresist composition comprising: (a) a base soluble polymer comprising at least one sulfonyl group where at least one carbon atom at α-position and/or β-position with respect to the sulfonyl group has a hydroxyl group, where the hydroxyl group is protected or unprotected; and (b) a solvent;
 b) baking the substrate to substantially remove the solvent;
 c) imagewise irradiating the photoresist film;
 d) baking the photoresist film; and,
 e) developing the irradiated photoresist film using an alkali developer.

4. The process of claim 3, further comprising coating an antireflective film on the substrate prior to coating the photoresist.

5. The process of claim 3, wherein the photoresist film is imagewise irradiated using immersion lithography.

6. A process for forming an image on a substrate comprising:
 a) coating the substrate with an antireflective composition comprising a base soluble polymer comprising at least one sulfonyl group where at least one carbon atom at α-position and/or β-position with respect to the sulfonyl group has a hydroxyl group, where the hydroxyl group is protected or unprotected; and at least one crosslinking agent;
 b) heating the coating of step a);
 c) forming a coating from a photoresist solution on the coating of step b);
 d) heating the photoresist coating to substantially remove solvent from the coating;
 e) image-wise exposing the photoresist coating;
 f) developing an image using an aqueous alkaline developer;
 g) optionally, heating the substrate prior to and after development; and
 h) dry etching the composition of step b).

* * * * *